US012660221B2

(12) United States Patent
Mahajan et al.

(10) Patent No.: US 12,660,221 B2
(45) Date of Patent: Jun. 16, 2026

(54) GATED PROTECTION DEVICE STRUCTURES FOR AN ELECTROSTATIC DISCHARGE PROTECTION CIRCUIT

(71) Applicant: GlobalFoundries U.S. Inc., Malta, NY (US)

(72) Inventors: Prantik Mahajan, Dresden (DE); Ajay, Aligarh (IN); Souvick Mitra, Essex Junction, VT (US); Robert J. Gauthier, Williston, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 820 days.

(21) Appl. No.: 17/901,015

(22) Filed: Sep. 1, 2022

(65) Prior Publication Data

US 2024/0079482 A1      Mar. 7, 2024

(51) Int. Cl.
*H10D 18/00* (2025.01)
*H10D 62/10* (2025.01)
*H10D 84/00* (2025.01)

(52) U.S. Cl.
CPC ......... *H10D 18/241* (2025.01); *H10D 18/251* (2025.01); *H10D 62/126* (2025.01); *H10D 84/138* (2025.01); *H10D 62/116* (2025.01)

(58) Field of Classification Search
CPC combination set(s) only.
See application file for complete search history.

(56) References Cited

U.S. PATENT DOCUMENTS 7,719,026 B2     5/2010  Lou et al.
2004/0016992 A1*  1/2004  Mallikarjunaswamy ...................
                                  H10D 89/713
                                        257/362

(Continued)

FOREIGN PATENT DOCUMENTS

CN       108878417 A      11/2018
CN       113764403 A      12/2021

OTHER PUBLICATIONS

Song Wenqiang et al: "Design of A Novel Low Voltage Triggered Silicon Controlled Rectifier (SCR) for ESD Applications", 2020 International EOS/ESD Symposium on Design and System (IEDS), EOS/ESD Association Inc, Jun. 23, 2021 (Jun. 23, 2021), pp. 1-4.

(Continued)

*Primary Examiner* — Mark W Tornow
*Assistant Examiner* — Priya M Rampersaud
(74) *Attorney, Agent, or Firm* — Thompson Hine LLP; Francois Pagette

(57) ABSTRACT

Device structures including a silicon-controlled rectifier and methods of forming a device structure including a silicon-controlled rectifier. The device structure comprises a first well and a second well in a semiconductor substrate, a first terminal including a first doped region in the first well, and a second terminal including a second doped region in the second well. The first well and the second doped region have a first conductivity type, and the second well and the first doped region have a second conductivity type opposite from the first conductivity type. The second well adjoins the first well along an interface. A third doped region includes a first portion in the first well and a second portion in the second well, and a gate structure that overlaps with a portion of the second well.

20 Claims, 13 Drawing Sheets

(56) References Cited

U.S. PATENT DOCUMENTS

| | | | | |
|---|---|---|---|---|
| 2007/0018193 A1* | 1/2007 | Ker | ..................... | H10D 89/713 |
| | | | | 257/119 |
| 2009/0212323 A1* | 8/2009 | Liu | ..................... | H10D 89/713 |
| | | | | 257/E21.61 |
| 2014/0159102 A1* | 6/2014 | Van Wijmeersch | ..... | H10D 8/80 |
| | | | | 257/109 |
| 2014/0225228 A1* | 8/2014 | Salcedo | .............. | H10D 84/854 |
| | | | | 257/575 |
| 2015/0194420 A1 | 7/2015 | Wang et al. | | |
| 2016/0163690 A1* | 6/2016 | Ko | ....................... | H10D 89/713 |
| | | | | 257/133 |
| 2016/0343701 A1* | 11/2016 | Zhong | ..................... | H10D 8/80 |
| 2020/0058781 A1* | 2/2020 | Zhu | ..................... | H10D 64/111 |
| 2022/0293585 A1* | 9/2022 | Liou | ................... | H10D 89/713 |

OTHER PUBLICATIONS

European Patent Office, Extended European Search Report and Opinion issued in European Patent Application No. 23182965.6 on Jan. 30, 2024; 9 pages.

M. Shrivastava, J. Schneider, R. Jain, M. S. Baghini, H. Gossner and V. R. Rao, "IGBT plugged in SCR device for ESD protection in advanced CMOS technology," 2009 31st EOS/ESD Symposium, 2009, pp. 1-9.

Mahajan, Prantik et al., "Electrostatic Discharge Protection Devices Including a Silicon-Controlled Rectifier" filed Apr. 20, 2022 as a U.S. Appl. No. 17/724,548.

European Patent Office; Communication pursuant to Article 94(3) EPC issued in European Patent Application No. 23182965.6 on Oct. 21, 2025; 7 pages.

* cited by examiner

GATED PROTECTION DEVICE STRUCTURES FOR AN ELECTROSTATIC DISCHARGE PROTECTION CIRCUIT

BACKGROUND

The disclosure relates generally to semiconductor devices and integrated circuit fabrication and, more specifically, to device structures including a silicon-controlled rectifier and methods of forming a device structure including a silicon-controlled rectifier.

An integrated circuit may be exposed to random electrostatic discharge (ESD) events that can direct potentially large and damaging ESD currents to the sensitive devices of the integrated circuit. An ESD event refers to an unpredictable electrical discharge of a positive or negative current over a short duration and during which a large amount of current is directed toward the integrated circuit. An ESD event may occur during post-manufacture chip handling or after chip installation on a circuit board or other carrier. An ESD event may originate from a variety of sources, such as the human body, a machine component, or a chip carrier.

Precautions may be taken to protect the integrated circuit from an ESD event. One such precaution is an on-chip protection circuit that is designed to avert damage to the sensitive devices of the integrated circuit during an ESD event. If an ESD event occurs, a protection device of the protection circuit is triggered to enter a low-impedance state that conducts the ESD current to ground and thereby shunts the ESD current away from the sensitive devices of the integrated circuit. The protection device remains clamped in its low-impedance state until the ESD current is drained and the ESD voltage is discharged to an acceptable level.

A common type of protection device deployed in an ESD protection circuit is a silicon-controlled rectifier (SCR). In its quiescent high-impedance state, the SCR restricts current conduction to leakage current. However, a voltage pulse exceeded an engineered threshold, known as the trigger voltage, initiates the conduction of a forward current between the anode and cathode of the SCR. Even after the trigger voltage is removed, the SCR remains clamped in its low-impedance state to conduct the forward current so long as the forward current remains above another engineered threshold, known as the holding current. When the forward current from the ESD event drops below the holding current, the SCR returns to its quiescent high-impedance state.

Improved device structures including a silicon-controlled rectifier and methods of forming a device structure including a silicon-controlled rectifier are needed.

SUMMARY

In an embodiment, a device structure comprises a first well and a second well in a semiconductor substrate, a first terminal including a first doped region in the first well, and a second terminal including a second doped region in the second well. The first well and the second doped region have a first conductivity type, and the second well and the first doped region have a second conductivity type opposite from the first conductivity type. The second well adjoins the first well along an interface. A third doped region includes a first portion in the first well and a second portion in the second well, and a gate structure that overlaps with a portion of the second well.

In an embodiment, a method comprises forming a first well and a second well in a semiconductor substrate, forming a first doped region of a first terminal in the first well, and forming a second doped region of a second terminal in the second well. The first well and the second doped region have a first conductivity type, and the second well and the first doped region have a second conductivity type opposite from the first conductivity type. The second well adjoins the first well along an interface. The method further comprises forming a third doped region that includes a first portion in the first well and a second portion in the second well, and forming a gate structure that overlaps with a portion of the second well.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
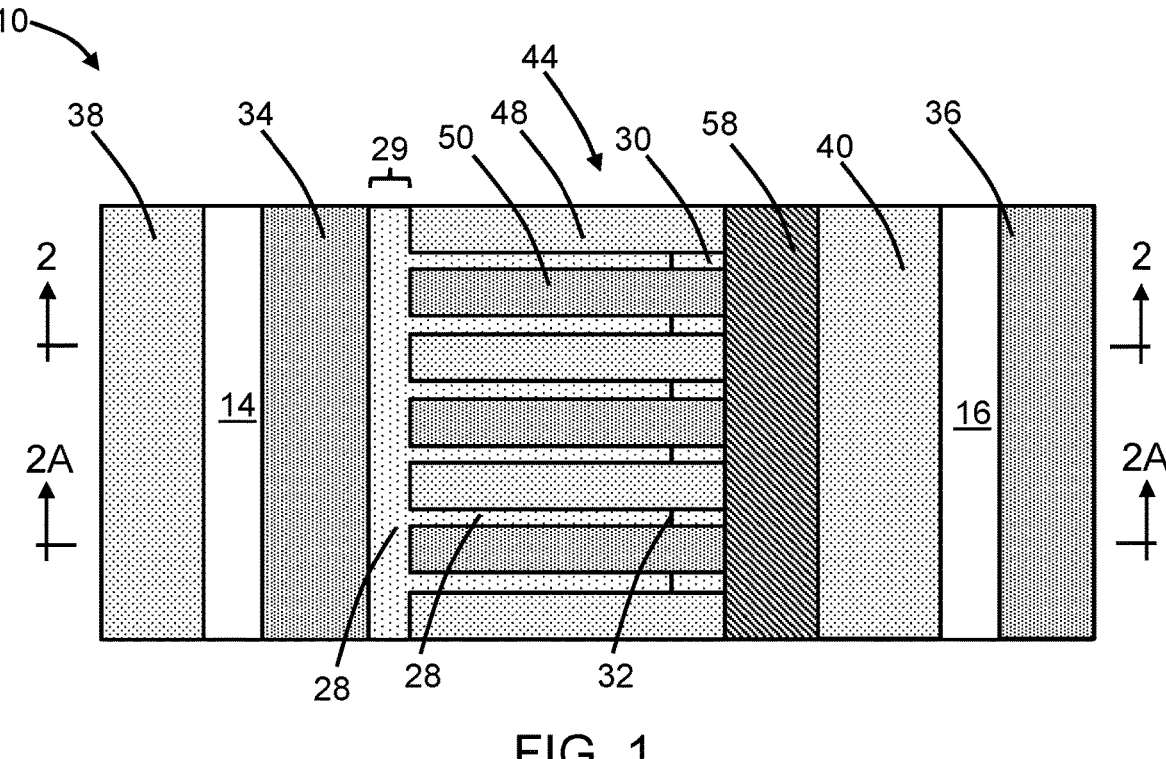
FIG. 1 is a top view of a device structure in accordance with embodiments of the invention.
Figure 2:
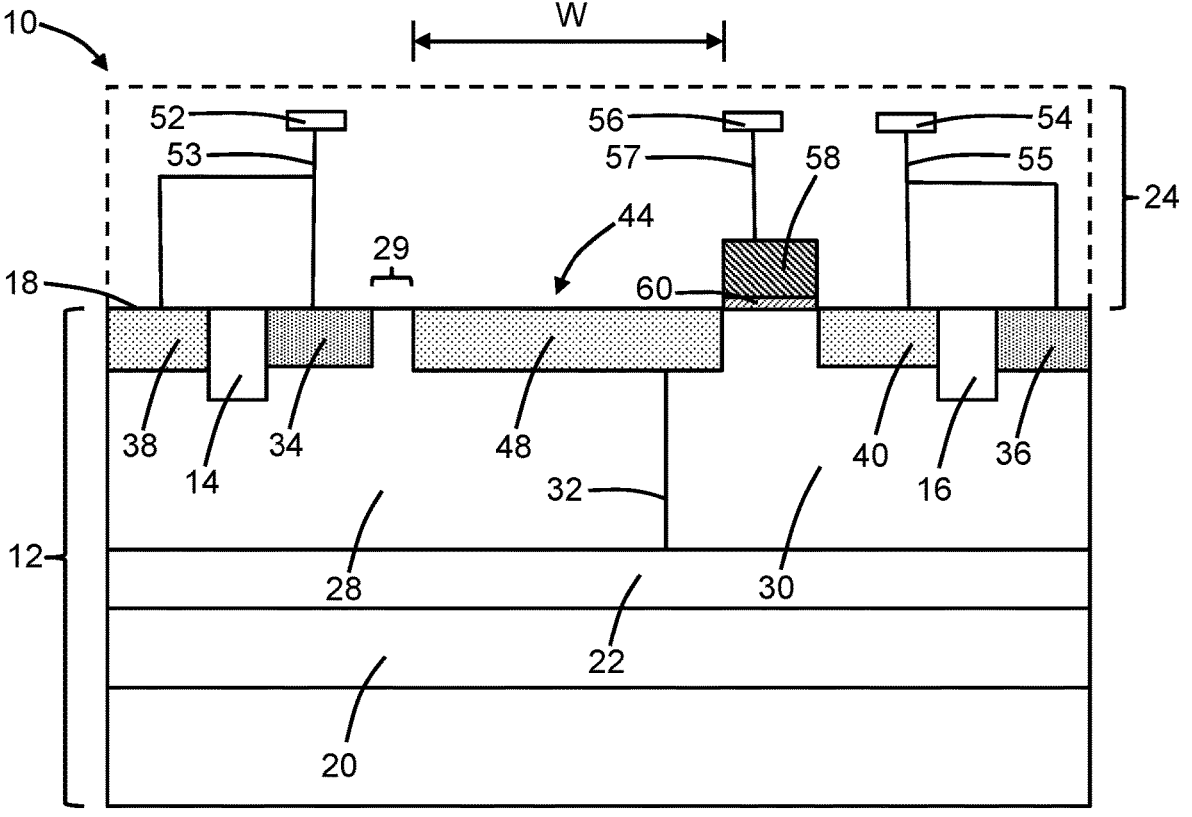
FIG. 2 is a cross-sectional view taken generally along line 2-2 in FIG. 1.
Figure 2A:
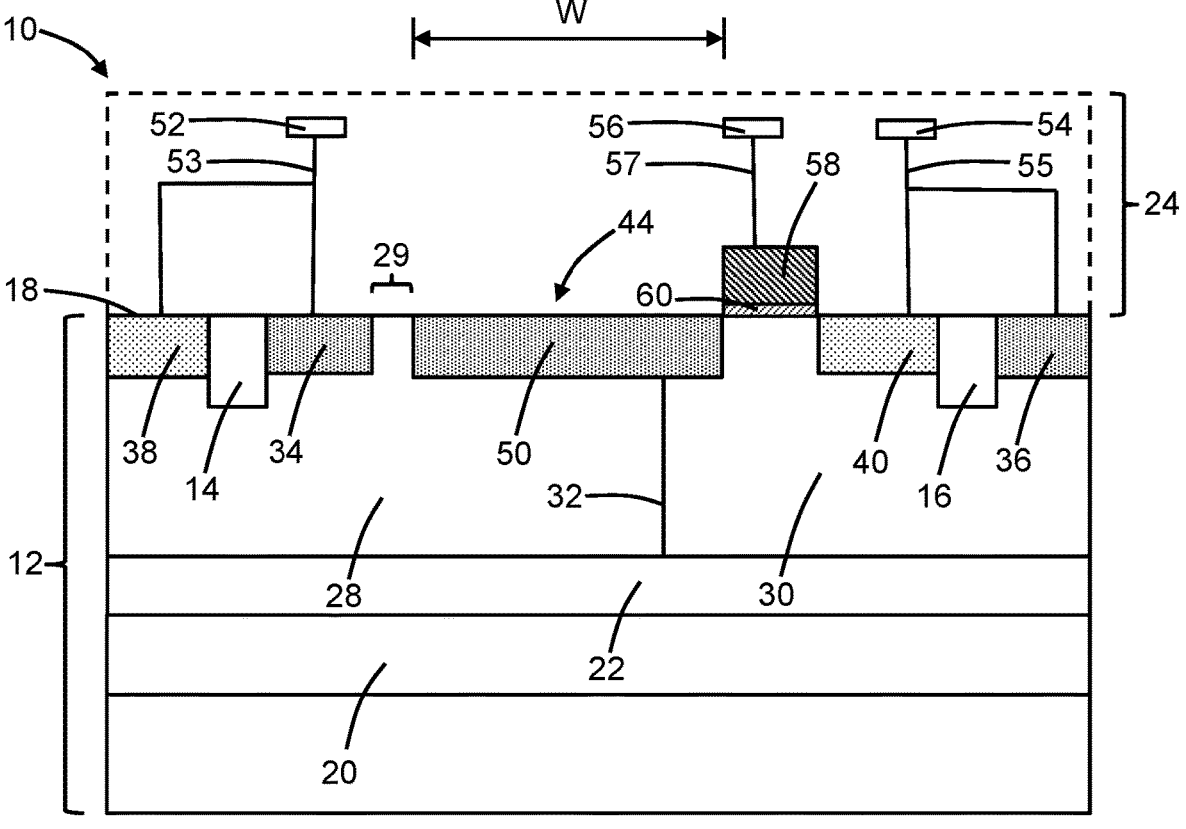
FIG. 2A is a cross-sectional view taken generally along line 2A-2A in FIG. 1.

With reference to FIGS. 1, 2, 2A and in accordance with embodiments of the invention, a device structure 10 includes a semiconductor substrate 12 and shallow trench isolation regions 14, 16 that are arranged in the semiconductor substrate 12. The semiconductor substrate 12 may be comprised of a semiconductor material, such as single-crystal silicon, and the semiconductor substrate 12 may be initially doped, before subsequent processing, to have, for example, p-type conductivity. The shallow trench isolation regions 14, 16 may be formed by patterning shallow trenches in the semiconductor substrate 12 with lithography and etching processes, depositing a dielectric material, such as silicon dioxide, in the shallow trenches, and planarizing and/or recessing the deposited dielectric material.

A deep well 20 is positioned in the semiconductor substrate 12. The portion of the semiconductor substrate 12 beneath the deep well 20 has an opposite conductivity type from the deep well 20. In an embodiment, the deep well 20 may be doped with a concentration of an n-type dopant (e.g., arsenic or phosphorus) to provide n-type conductivity. The deep well 20 may be formed by introducing a dopant by, for example, ion implantation into the semiconductor substrate 12. The implantation conditions (e.g., ion species, dose, kinetic energy) may be selected to tune the electrical and physical characteristics of the deep well 20.

A well 22 is positioned in the semiconductor substrate 12 between the deep well 20 and the top surface 18 of the semiconductor substrate 12 in a vertical direction. The well 22, which is doped to have an opposite conductivity type from the deep well 20, adjoins the deep well 20 along an interface. In an embodiment, the deep well 20 may fully separate the well 22 from the portion of the semiconductor substrate 12 beneath the deep well 20. The well 22 may be formed by introducing a dopant by, for example, ion implantation into the semiconductor substrate 12. Implantation conditions (e.g., ion species, dose, kinetic energy) may be selected to tune the electrical and physical characteristics of the well 22. In an embodiment, the well 22 may be doped with a concentration of a p-type dopant (e.g., boron) to provide p-type conductivity.

Wells 28, 30 are positioned in the semiconductor substrate 12. The wells 28, 30, each of which has a horizontal interface with the well 22, are positioned in a vertical direction between the wells 20, 22 and the top surface 18 of the semiconductor substrate 12. The well 28 may be doped to have the same conductivity type as the well 22 but at a higher dopant concentration than the well 22, and an opposite conductivity type from the deep well 20. A portion of the well 22 is positioned in a vertical direction between the deep well 20 and the well 28. The well 30 may be doped to have the same conductivity type as the deep well 20 but at a higher dopant concentration than the deep well 20, and an opposite conductivity type from the well 22. A portion of the well 22 is positioned in a vertical direction between the deep well 20 and the well 30. The well 28 and the well 30 adjoin along an interface 32 across which the conductivity type changes to define a p-n junction.

The well 28 may be formed by introducing a dopant of a given conductivity type by, for example, ion implantation into the semiconductor substrate 12. A patterned implantation mask may be formed to define a selected area on the top surface 18 of the semiconductor substrate 12 that is exposed for the implantation of ions. The implantation mask may include a layer of an organic photoresist that is applied and patterned to form an opening exposing the selected area on the top surface 18 of the semiconductor substrate 12 and determining, at least in part, the location and horizontal dimensions of the well 28. The implantation mask has a thickness and stopping power sufficient to block the implantation of ions in masked areas. The implantation conditions (e.g., ion species, dose, kinetic energy) may be selected to tune the electrical and physical characteristics of the well 28. In an embodiment, the well 28 may be doped with a concentration of a p-type dopant (e.g., boron) to provide p-type conductivity.

The well 30 may be formed by introducing a dopant of a given conductivity type by, for example, ion implantation into the semiconductor substrate 12. A patterned implantation mask may be formed to define a selected area on the top surface 18 of the semiconductor substrate 12 that is exposed for the implantation of ions. The implantation mask may include a layer of an organic photoresist that is applied and patterned to form an opening exposing the selected area on the top surface 18 of the semiconductor substrate 12 and determining, at least in part, the location and horizontal dimensions of the well 30. The implantation mask has a thickness and stopping power sufficient to block the implantation of ions in masked areas. The implantation conditions (e.g., ion species, dose, kinetic energy) may be selected to tune the electrical and physical characteristics of the well 30. In an embodiment, the well 30 may be doped with a concentration of an n-type dopant (e.g., arsenic or phosphorus) to provide n-type conductivity.

A doped region 34 is positioned in the well 28 adjacent to the top surface 18 of the semiconductor substrate 12, and a doped region 36 is positioned in the well 30 adjacent to the top surface 18 of the semiconductor substrate 12. The doped region 34 may be doped to have an opposite conductivity type from the well 28, and the doped region 36 may be doped to have the same conductivity type as the well 30. In an embodiment, the doped regions 34, 36 may be doped (e.g., heavily doped) with a concentration of an n-type dopant (e.g., arsenic or phosphorus) to provide n-type conductivity. The doped regions 34, 36 may be concurrently formed by selectively implanting ions, such as ions including the n-type dopant, with an implantation mask having openings defining the intended locations for the doped regions 34, 36 in the semiconductor substrate 12. The doped region 36 may provide a contact to the well 30.

A doped region 38 is positioned in the well 28 adjacent to the top surface 18 of the semiconductor substrate 12, and a doped region 40 is positioned in the well 30 adjacent to the top surface 18 of the semiconductor substrate 12. The doped region 38 may be doped to have the same conductivity type as the well 28 but at a higher dopant concentration. The doped region 40 may be doped to have an opposite conductivity type from the well 30. In an embodiment, the doped regions 38, 40 may be doped (e.g., heavily doped) with a concentration of a p-type dopant (e.g., boron) to provide p-type conductivity. The doped regions 38, 40 may be concurrently formed by selectively implanting ions, such as ions including the p-type dopant, with an implantation mask having openings defining the intended locations for the doped regions 38, 40 in the semiconductor substrate 12. The shallow trench isolation region 14 is positioned in a lateral direction between the doped region 34 and the doped region 38, and the shallow trench isolation region 16 is positioned in a lateral direction between the doped region 36 and the doped region 40. The doped region 38 may provide a contact to the well 28.

A doped region 44 is positioned adjacent to the top surface 18 of the semiconductor substrate 12. The doped region 44 is positioned in lateral direction between the doped region 34 and the doped region 40. A finger 29 of the well 28 separates the doped region 44 from the doped region 34, and the doped region 44 overlaps with the interface 32.

The doped region 44 may be segmented with sections 48 having one conductivity type and sections 50 that have an opposite conductivity type from the sections 48. The sections 48 longitudinally alternate with the sections 50 along a length of the doped region 44. A portion of each section 48 overlaps with the well 28, and another portion of each section 48 overlaps with the well 30. Similarly, a portion of each section 50 overlaps with the well 28, and another portion of each section 50 overlaps with the well 30. In an embodiment, the sections 48 may have the same conductivity type as the well 28 but at a higher dopant concentration, and the sections 48 may have an opposite conductivity type from the well 30. In an embodiment, the sections 50 may have an opposite conductivity type from the well 28, and the sections 50 may have the same conductivity type as the well 30 but at a higher dopant concentration. In an embodiment, the sections 48 may be doped with a concentration of a p-type dopant (e.g., boron) to provide p-type conductivity, and the sections 50 may be doped with a concentration of an n-type dopant (e.g., arsenic or phosphorus) to provide n-type conductivity.

The sections 48 may be formed by masked ion implantation concurrently with the formation of the doped regions 38, 40, and the sections 50 may be formed by masked ion implantation concurrently with formation of the doped region 34, 36. Adjacent portions of the wells 28, 30, which are masked during the implantations, are positioned in a longitudinal direction between the sections 48 and the sections 50 such that the sections 48 and the sections 50 have a spaced-apart arrangement and such that adjacent pairs of the sections 48 and the sections 50 are not adjoining. The sections 48 and the sections 50 define implanted slices or strips that may extend across a full width W of the doped region 44, and the portions of the wells 28, 30 define non-implanted slices or strips that extend across the full width W of the doped region 44.

A gate structure including a gate electrode 58 and a gate dielectric layer 60 may be positioned on the top surface 18 of the semiconductor substrate 12. The gate dielectric layer 60 is comprised of a dielectric material, such as hafnium oxide or silicon dioxide, that is an electrical insulator. The gate electrode 58 is comprised of a conductor, such as a work function metal or doped polysilicon. The gate electrode 58 and gate dielectric layer 60 may be formed by patterning layers of their respective materials with lithography and etching processes. The gate structure overlaps with a portion of the underlying well 30 and is positioned in a lateral direction between the doped region 40 and the doped region 44 having an opposite conductivity type from the well 30. The doped region 40 and the doped region 44 may be characterized as source/drain regions associated with the gate structure. As used herein, the term "source/drain region" means a doped region of semiconductor material that can function as either a source or a drain of a field-effect transistor. The portion of the well 30 overlapped by the gate structure is also positioned in a lateral direction between the doped region 40 and the interface 32 between the wells 28, 30.

Middle-of-line processing and back-end-of-line processing follow, which includes formation of an interconnect structure 24 with electrical connections coupled to the device structure 10. The doped region 44 is not coupled to electrical connections in the interconnect structure 24 and, for that reason, the doped region 44 is configured to be electrically floating. The doped regions 34, 38 may be coupled together by an electrical connection 53 in the interconnect structure 24 to define a terminal 52 of the device structure 10, and the doped regions 36, 40 may be coupled together by an electrical connection 55 in the interconnect structure 24 to define another terminal 54 of the device structure 10. The terminal 52 may provide a cathode of the device structure 10 and the terminal 54 may provide an anode of the device structure 10. The gate electrode 58 of the gate structure is coupled by an electrical connection 57 in the interconnect structure 24 to define a gate terminal 56 of the device structure 10. The interconnect structure 24 may include stacked dielectric layers in which each dielectric layer is comprised of a dielectric material, such as silicon dioxide, silicon nitride, tetraethylorthosilicate silicon dioxide, or fluorinated-tetraethylorthosilicate silicon dioxide, and the electrical connections 53, 55, 57 may be comprised of one or more metals, such as tungsten and copper.

The device structure 10 may embody a unidirectional electrostatic discharge device including a combination of an insulated gate bipolar transistor and a silicon-controlled rectifier integrating a gate terminal. The device structure 10 is encompassed by the deep well 20 and includes the gate structure that adjoins the floating doped region 44. The floating doped region 44, which may be segmented into the sections 48, 50, is separated in a lateral direction from the doped region 34 of the cathode by a space occupied by the finger 29 of the well 28. The device structure 10 includes a parasitic vertical NPN bipolar transistor defined by the doped region 34, the wells 22, 28, and the deep well 20. The device structure 10 includes a parasitic vertical silicon-controlled rectifier defined by the doped region 40, the well 30, the well 22, and the deep well 20. The parasitic vertical silicon-controlled rectifier of the device structure 10 integrates a vertical PNP bipolar transistor defined by the doped region 40, the well 30, and the well 22 with base bias control provided by the gate structure.

The triggering voltage and the holding voltage of the device structure 10 may be modified by an electrical bias applied at the gate terminal 56 to the gate electrode 58 of the gate structure. The holding voltage may be tuned by adjusting the bias applied to the gate electrode 58 of the gate structure. The on-resistance and failure current of the device structure 10 may be improved by the presence of the doped region 44 that is electrically floating and that is fully segmented into the sections 48, 50. The device structure 10 may provide an area-efficient medium-voltage and high-voltage electrostatic discharge protection device to protect, for example, a power pad, and may be formed without the need for an extra mask in the process flow.

Figure 3:
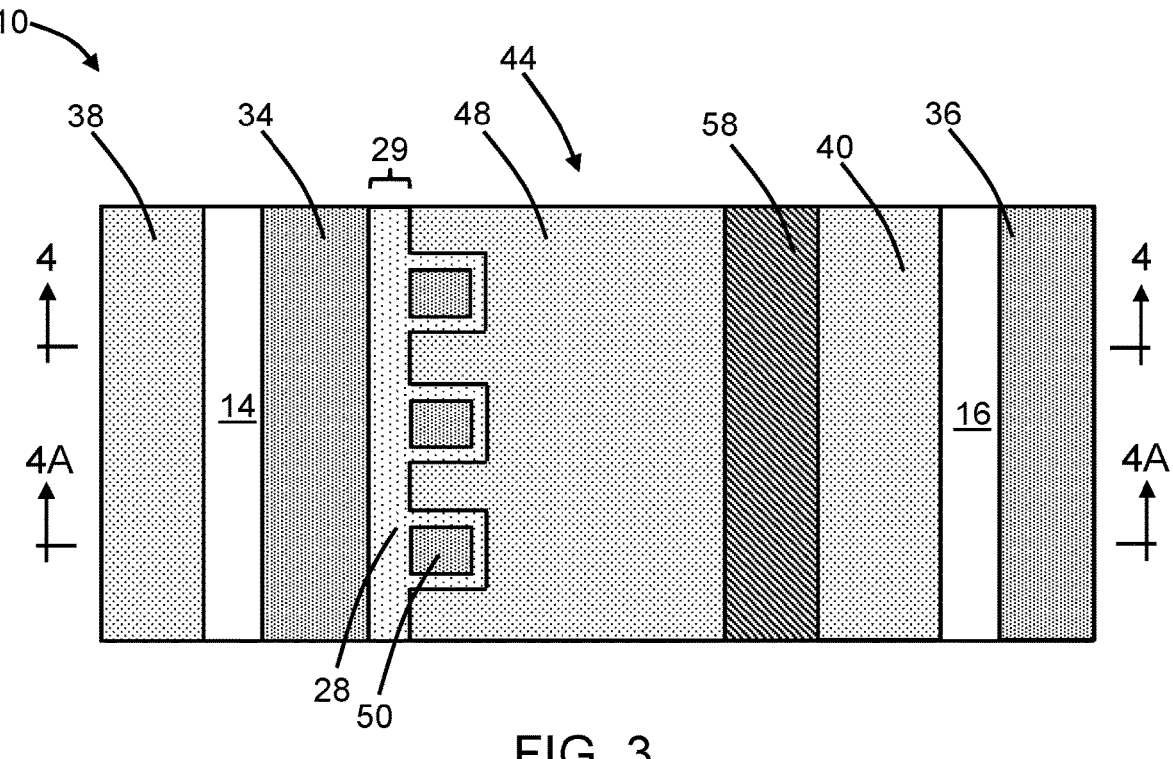
FIG. 3 is a top view of a structure in accordance with alternative embodiments of the invention.
Figure 4:
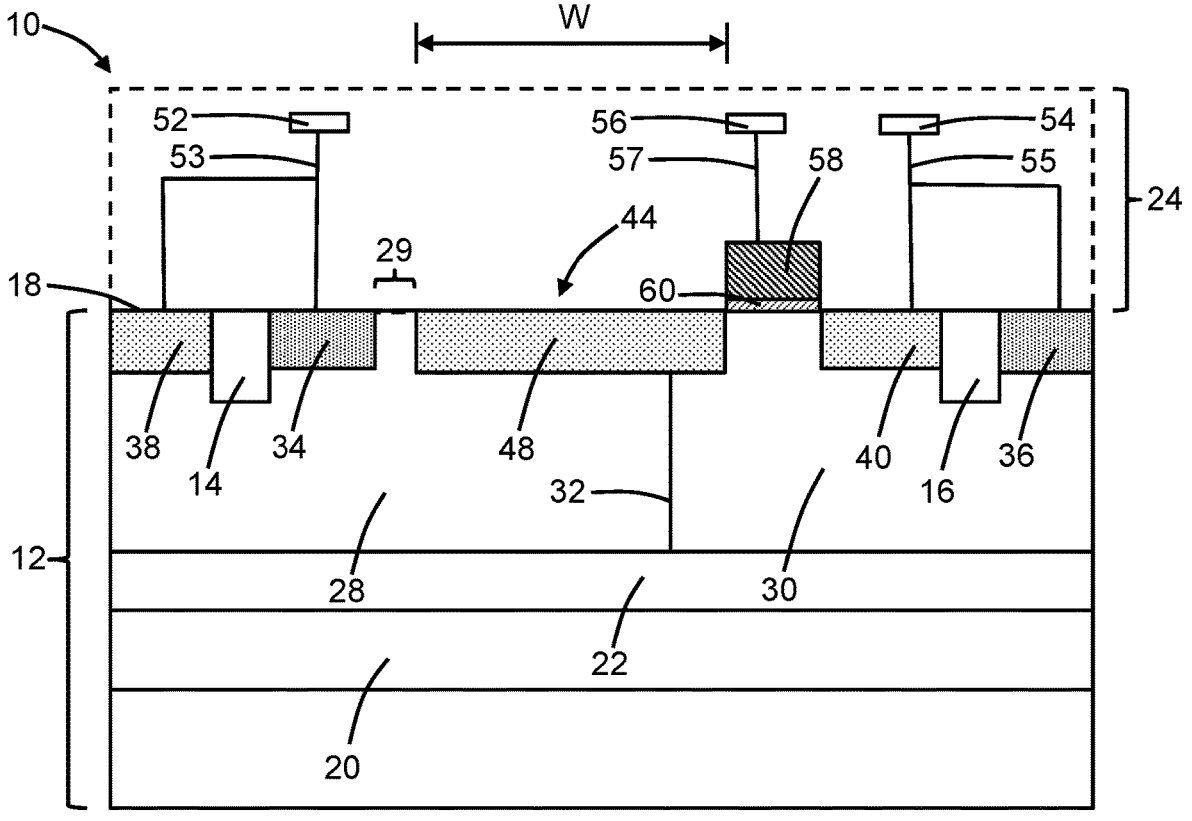
FIG. 4 is a cross-sectional view taken generally along line 4-4 in FIG. 3.
Figure 4A:
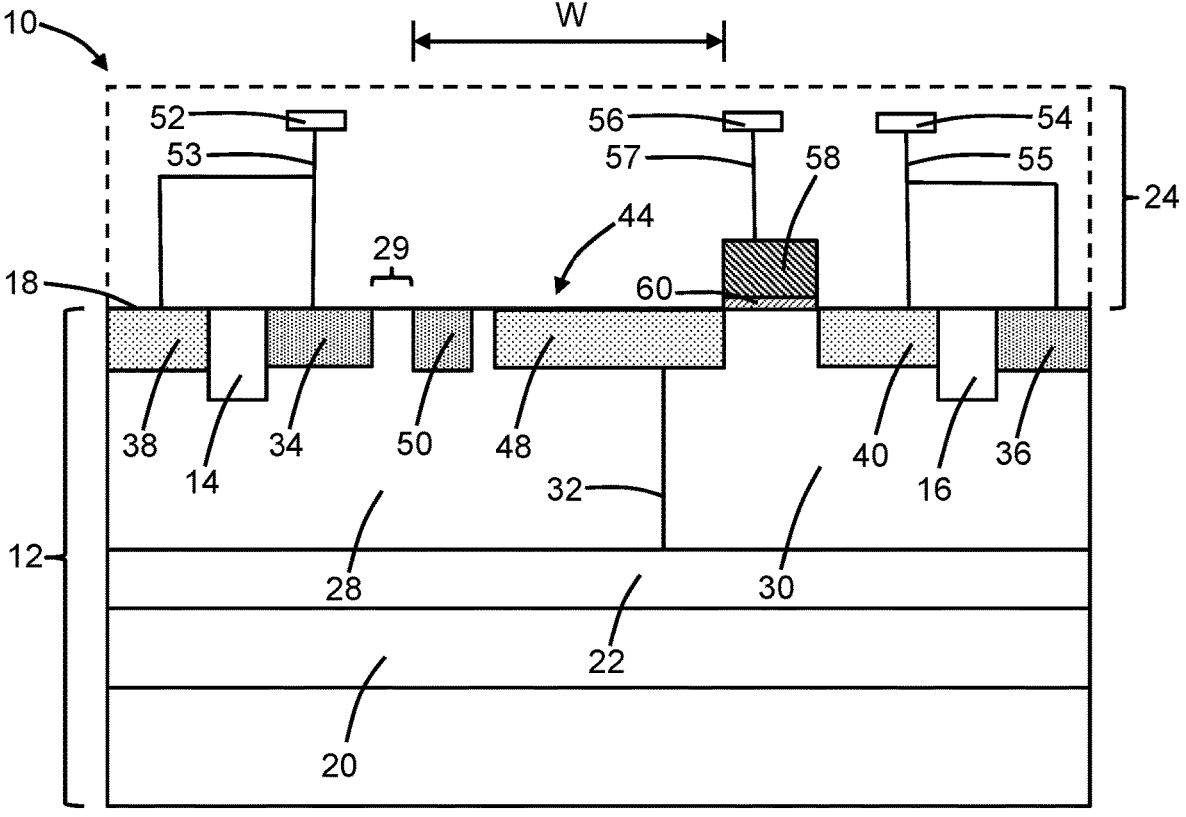
FIG. 4A is a cross-sectional view taken generally along line 4A-4A in FIG. 3.

With reference to FIGS. 3, 4, 4A in which like reference numerals refer to like features in FIGS. 1, 2, 2A and in accordance with alternative embodiments of the invention, the doped region 44 of the device structure 10 may be partially segmented with sections 50 that are embedded inside a single section 48 of opposite conductivity type. The sections 50 may be formed along a side edge of the doped region 44 that is adjacent to the doped region 34 and non-adjacent to the gate electrode 58 of the gate structure. The sections 50 define islands that extend partially across the width W of the doped region 44.

Figure 5:
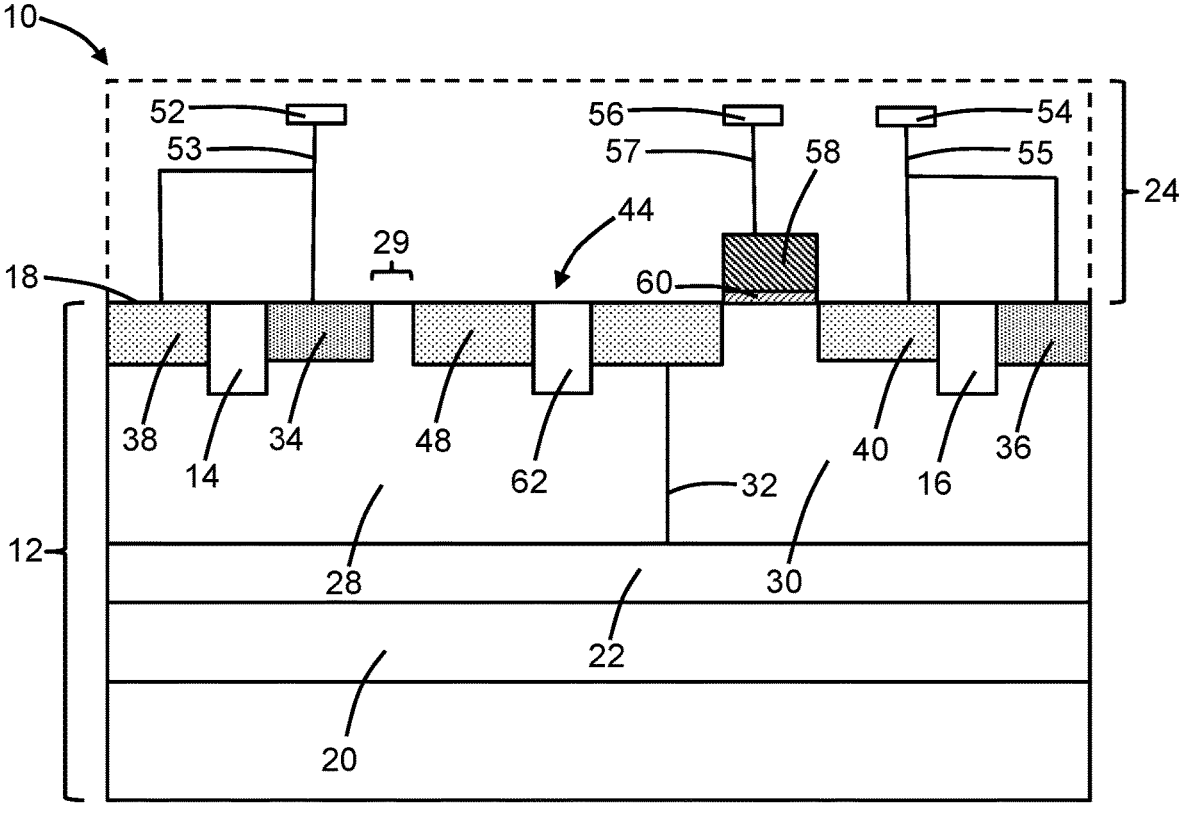
FIGS. 5, 5A are cross-sectional views of a device structure in accordance with alternative embodiments of the invention.
Figure 5A:
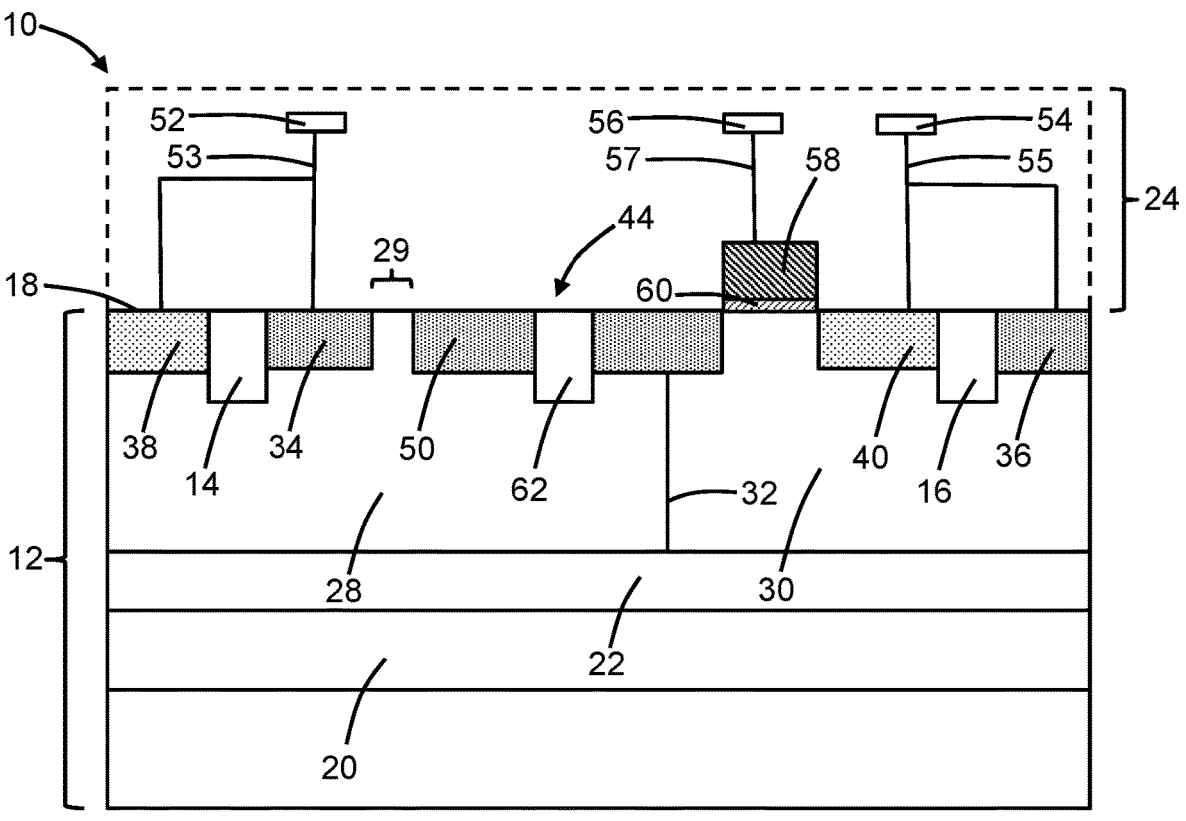

With reference to FIGS. 5, 5A and in accordance with alternative embodiments of the invention, the device structure 10 may include a shallow trench isolation region 62 that is formed in the semiconductor substrate 12. In an embodiment, the shallow trench isolation region 62 may extend along a full length of the doped region 44 such that the doped region 44 is fully subdivided (i.e., partitioned) into a pair of portions that are positioned on opposite sides of the shallow trench isolation region 62. One portion of the doped region 44 is located adjacent to the doped region 34 and between the doped region 34 and the shallow trench isolation region 62, and the other portion of the doped region 44 is located adjacent to the gate structure and between the gate structure and the shallow trench isolation region 62. The shallow trench isolation region 62 may be formed concurrently with the shallow trench isolation regions 14, 16.

Figure 6:
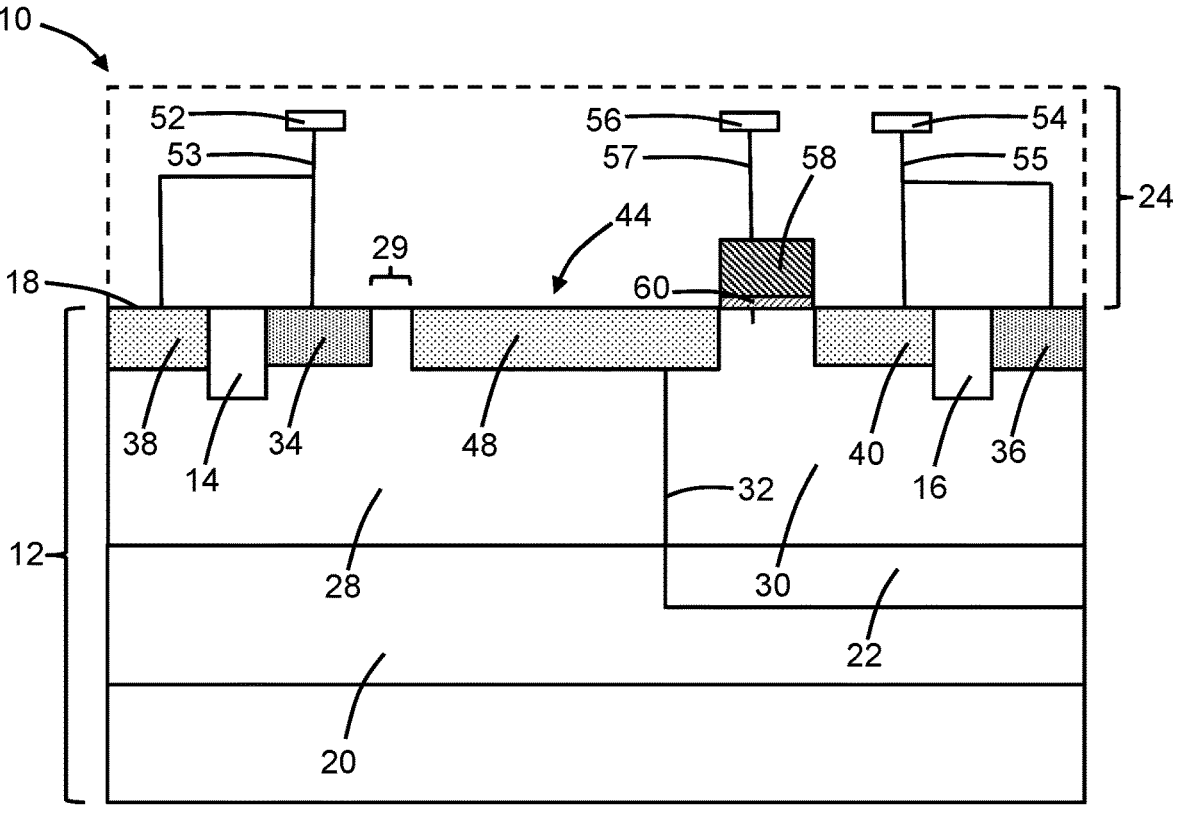
FIGS. 6, 6A are cross-sectional views of a device structure in accordance with alternative embodiments of the invention.
Figure 6A:
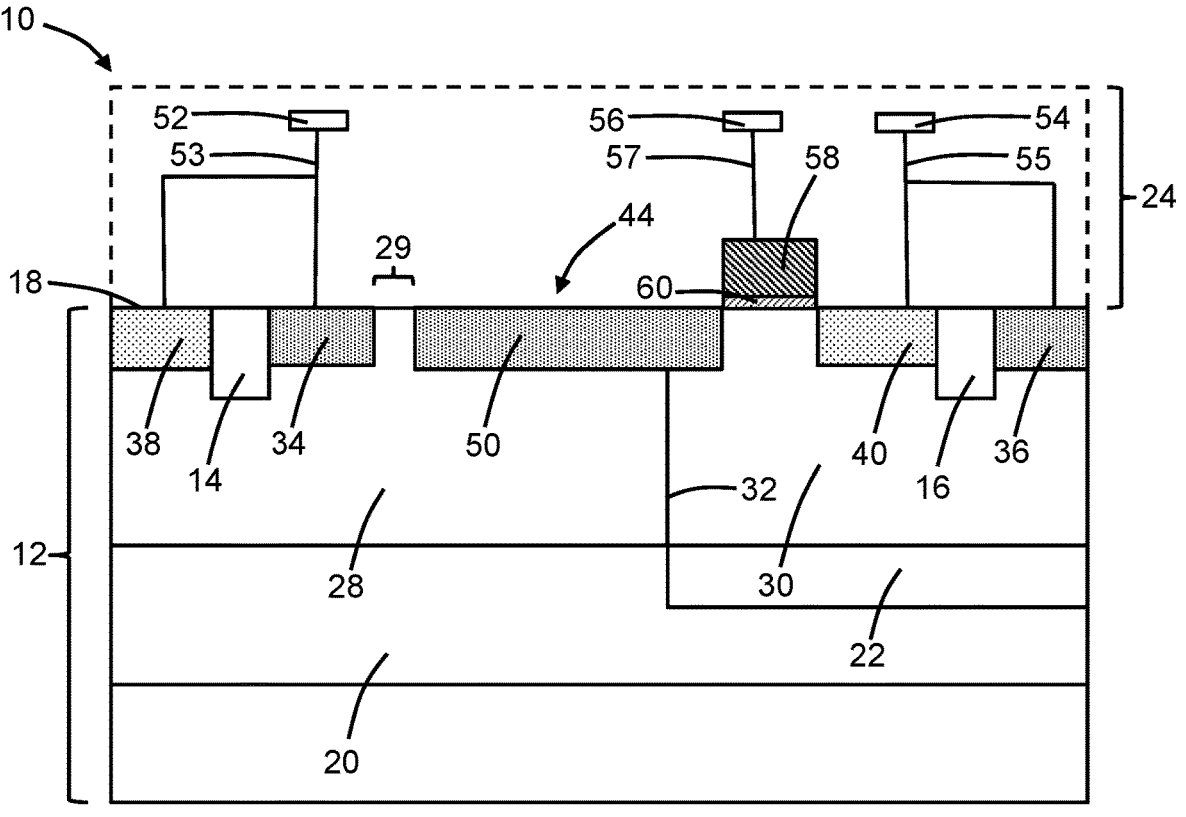

With reference to FIGS. 6, 6A and in accordance with alternative embodiments of the invention, the well 22 of the device structure 10 may be reduced in size such that the well 22 is located beneath the well 30 but not beneath the well 28. The well 22 maintains the horizontal interface with the well 30. The well 28, in the absence of the intervening portion of the well 22, has a horizontal interface with the well 20.

Figure 7:
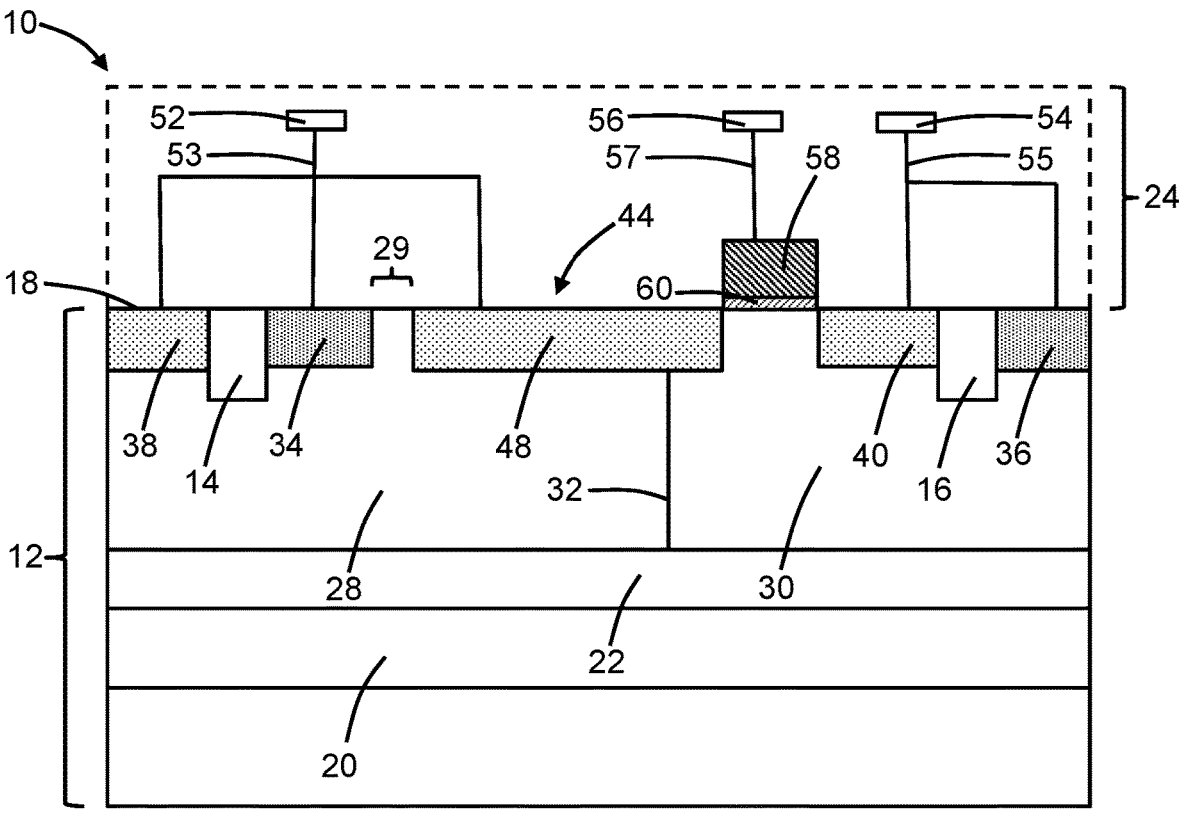
FIG. 7 is a cross-sectional view of a device structure in accordance with alternative embodiments of the invention.

With reference to FIG. 7 and in accordance with alternative embodiments of the invention, the doped region 44 of the device structure 10 may be coupled by the electrical connection 53 to the terminal 52 of the device structure 10 along with the doped regions 34, 38. As a result, the doped region 44 is shorted to the terminal 52.

Figure 8:
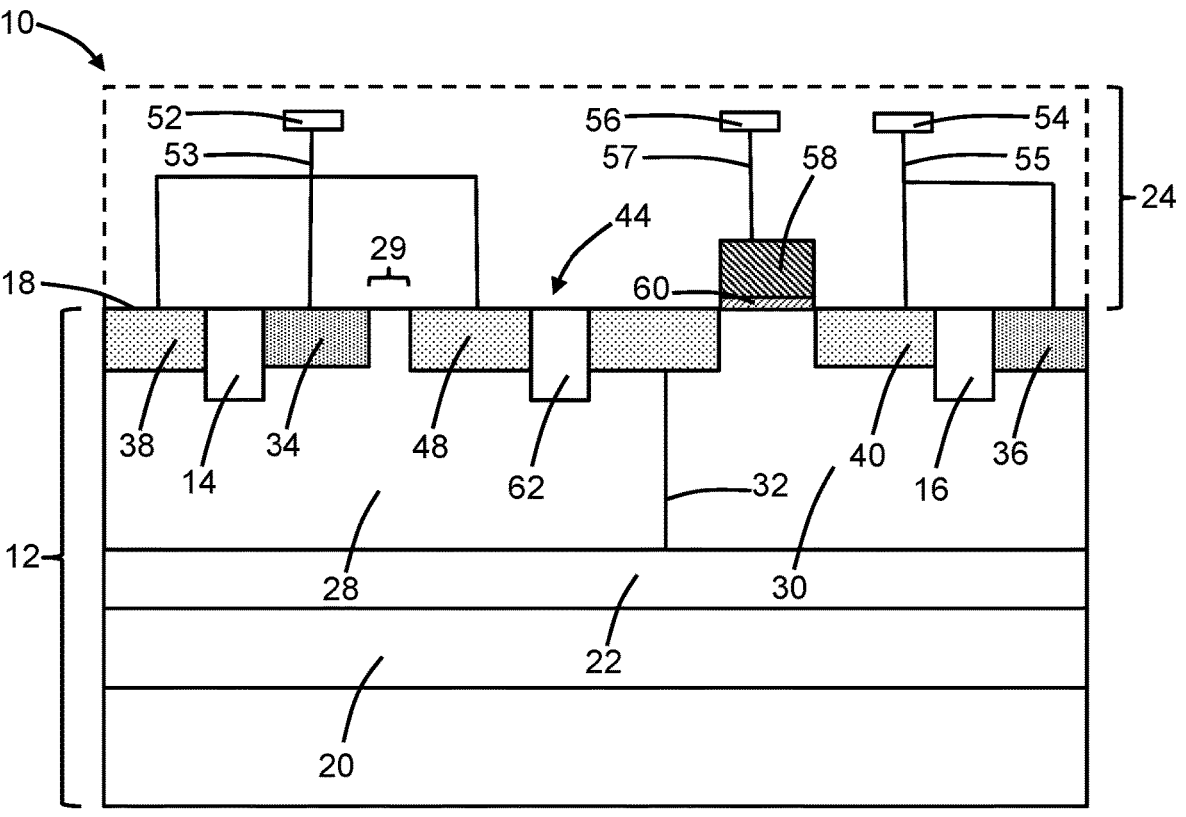
FIG. 8 is a cross-sectional view of a device structure in accordance with alternative embodiments of the invention.

With reference to FIG. 8 and in accordance with alternative embodiments of the invention, the portion of the doped region 44 between the shallow trench isolation region 62 and the doped region 34 may be coupled by the electrical connection 53 to the terminal 52 of the device structure 10 along with the doped regions 34, 38. As a result, the portion of the doped region 44 adjacent to the doped region 34 is shorted to the terminal 52. The other portion of the doped region 44, which is located adjacent to the gate structure, is floating and lacks a connection within the interconnect structure 24.

Figure 9:
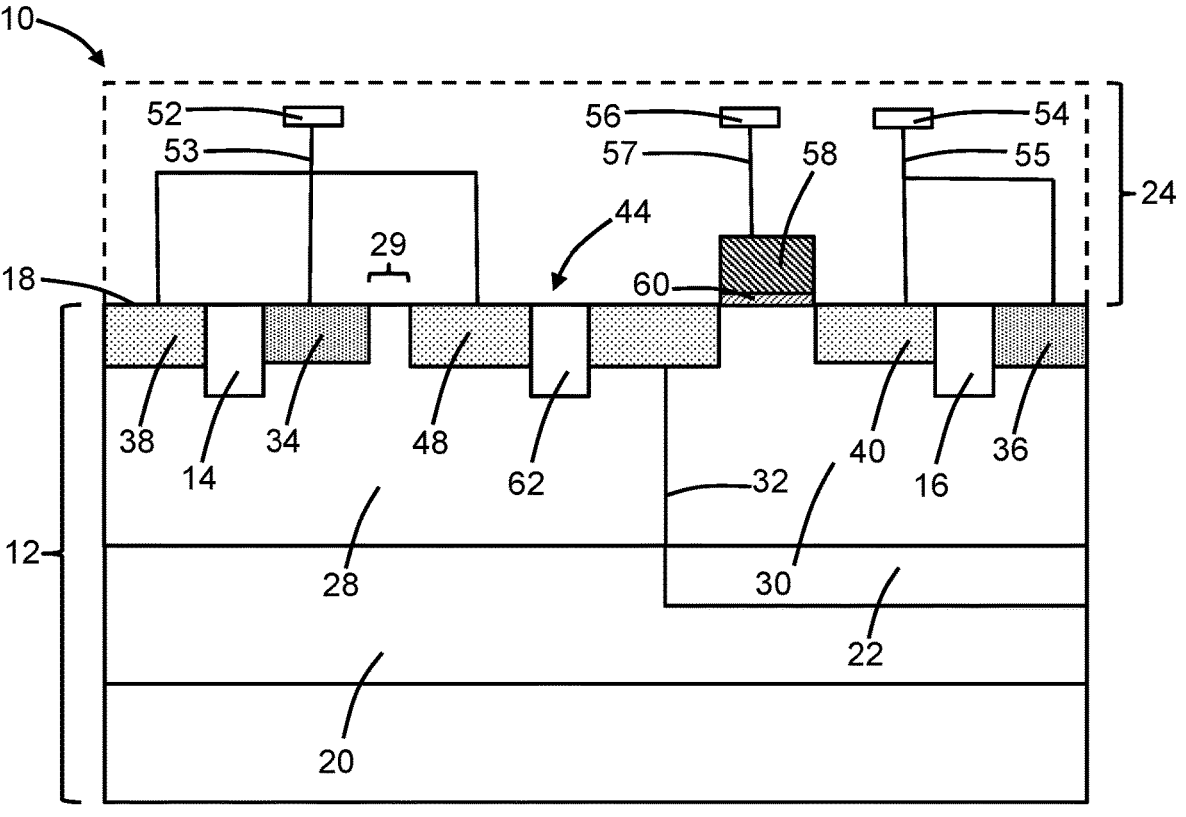
FIG. 9 is a cross-sectional view of a device structure in accordance with alternative embodiments of the invention.

With reference to FIG. 9 and in accordance with alternative embodiments of the invention, the device structure 10 may be modified to include the shallow trench isolation region 62, and the well 22 may be reduced in size and located only beneath the well 30.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature with either direct contact or indirect contact.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure comprising:
   a semiconductor substrate;
   a first well in the semiconductor substrate, the first well having a first conductivity type;
   a second well in the semiconductor substrate, the second well having a second conductivity type opposite from the first conductivity type, and the second well adjoining the first well along an interface;
   a first terminal including a first doped region in the first well, the first doped region having the second conductivity type;
   a second terminal including a second doped region in the second well, the second doped region having the first conductivity type;
   a third doped region including a first plurality of sections having the first conductivity type and a second plurality of sections having the second conductivity type, each of the first plurality of sections having a first portion in the first well and a second portion in the second well, each of the second plurality of sections having a first portion in the first well and a second portion in the second well, the first plurality of sections and the second plurality of sections alternate with a spaced-apart arrangement in a longitudinal direction along a length of the third doped region, and the first well and the second well include adjacent portions that are positioned between the first plurality of sections and the second plurality of sections to provide the spaced-apart arrangement, and the third doped region configured to be electrically floating; and
   a third terminal including a gate structure that overlaps with a portion of the second well,
   wherein the portion of the second well and the gate structure are positioned in a lateral direction between the second doped region and the third doped region.

2. The device structure of claim 1 wherein the semiconductor substrate has a top surface, and further comprising:
   a deep well in the semiconductor substrate, the deep well having the second conductivity type,
   wherein the first well and the second well are positioned in a vertical direction between the deep well and the top surface of the semiconductor substrate.

3. The device structure of claim 2 further comprising:
   a third well in the semiconductor substrate, the third well having the first conductivity type, wherein the third well is positioned between the second well and the deep well.

4. The device structure of claim 3 wherein the third well is positioned between the first well and the deep well.

5. The device structure of claim 1 wherein the semiconductor substrate has a top surface, and the gate structure is positioned on the top surface of the semiconductor substrate.

6. The device structure of claim 1 further comprising:
   a shallow trench isolation region in the semiconductor substrate, the shallow trench isolation region positioned in the third doped region.

7. The device structure of claim 1 wherein the first conductivity type is p-type, and the second conductivity type is n-type.

8. The device structure of claim 1 further comprising:

a fourth doped region in the first well, the fourth doped region having the first conductivity type; and an interconnect structure on the semiconductor substrate, the interconnect structure including a connection coupling the first doped region with the fourth doped region to provide the first terminal.

9. The device structure of claim 1 further comprising:

an interconnect structure on the semiconductor substrate, the interconnect structure including a first connection coupled to the first doped region to provide the first terminal and a second connection coupled to the second doped region to provide the second terminal.

10. The device structure of claim 1 wherein the third doped region overlaps with the interface.

11. A method comprising:

forming a first well in a semiconductor substrate, wherein the first well has a first conductivity type;

forming a second well in the semiconductor substrate, wherein the second well has a second conductivity type opposite from the first conductivity type, and the second well adjoins the first well along an interface;

forming a first doped region of a first terminal in the first well, wherein the first doped region has the second conductivity type;

forming a second doped region of a second terminal in the second well, wherein the second doped region has the first conductivity type;

forming a third doped region that includes a first plurality of sections having the first conductivity type and a second plurality of sections having the second conductivity type, wherein each of the first plurality of sections includes a first portion in the first well and a second portion in the second well, each of the second plurality of sections includes a first portion in the first well and a second portion in the second well, the first plurality of sections and the second plurality of sections alternate with a spaced-apart arrangement in a longitudinal direction along a length of the third doped region, the first well and the second well include adjacent portions that are positioned between the first plurality of sections and the second plurality of sections to provide the spaced-apart arrangement, and the third doped region is configured to be electrically floating; and forming a third terminal including a gate structure that overlaps with a portion of the second well, wherein the portion of the second well and the gate structure are positioned in a lateral direction between the second doped region and the third doped region.

12. The device structure of claim 1 wherein the gate structure is a single gate structure, the first well includes a finger between the first doped region and the third doped region, and the single gate structure has a non-overlapping relationship with the finger of the first well.

13. The device structure of claim 12 wherein the semiconductor substrate has a top surface, and further comprising:

a deep well in the semiconductor substrate, the deep well having the second conductivity type, wherein the first well and the second well are positioned in a vertical direction between the deep well and the top surface of the semiconductor substrate.

14. The device structure of claim 13 further comprising:

a third well in the semiconductor substrate, the third well having the first conductivity type, wherein the third well is positioned between the second well and the deep well.

15. The device structure of claim 14 wherein the third well is positioned between the first well and the deep well.

16. The device structure of claim 13 further comprising:

a third well in the semiconductor substrate, the third well having the first conductivity type, wherein the third well is positioned between the first well and the deep well.

17. The device structure of claim 2 further comprising:

a third well in the semiconductor substrate, the third well having the first conductivity type, wherein the third well is positioned between the first well and the deep well.

18. The device structure of claim 9 wherein the gate structure includes a gate electrode, and the interconnect structure includes a third connection coupled to the gate electrode to provide the third terminal.

19. The device structure of claim 18 wherein the first connection and the second connection are disconnected from the third connection.

20. The device structure of claim 19 wherein the gate electrode is configured to receive an electrical bias for tuning a holding voltage of the device structure.

* * * * *